(12) United States Patent
Yamazaki

(10) Patent No.: US 9,363,023 B2
(45) Date of Patent: Jun. 7, 2016

(54) SEMICONDUCTOR DEVICE FOR ELECTRICAL ISOLATION USING A PHOTOCOUPLER AND ISOLATOR TO CONVEY A SIGNAL

(71) Applicant: Renesas Electronics Corporation, Kawasaki-shi (JP)

(72) Inventor: Hiroaki Yamazaki, Kanagawa (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 179 days.

(21) Appl. No.: 13/861,287

(22) Filed: Apr. 11, 2013

(65) Prior Publication Data

US 2013/0313446 A1 Nov. 28, 2013

(30) Foreign Application Priority Data

May 22, 2012 (JP) .................................. 2012-116228

(51) Int. Cl.
*H04B 10/80* (2013.01)
(52) U.S. Cl.
CPC .... *H04B 10/802* (2013.01); *H01L 2224/05554* (2013.01); *H01L 2224/48091* (2013.01); *H01L 2224/48137* (2013.01); *H01L 2224/48247* (2013.01)
(58) Field of Classification Search
CPC .... H04B 10/80; H04B 10/801; H04B 10/802; H04B 1/587; H01L 31/167; H01L 31/16; H01L 31/173; H01L 31/165; H03K 17/785; H03K 17/78; H03K 17/7955
USPC ...................... 250/551, 214 R; 327/514, 515
See application file for complete search history.

(56) References Cited

U.S. PATENT DOCUMENTS

| | | | |
|---|---|---|---|
| 5,834,973 A * | 11/1998 | Klatser et al. ................. | 330/126 |
| 7,075,329 B2 | 7/2006 | Chen et al. | |
| 7,755,400 B2 * | 7/2010 | Jordanger et al. ............ | 327/142 |
| 2009/0295451 A1 | 12/2009 | Jordanger et al. | |
| 2010/0230782 A1 * | 9/2010 | Uchida et al. ................. | 257/531 |

FOREIGN PATENT DOCUMENTS

JP    S62-20000    1/1987

OTHER PUBLICATIONS

Japanese Office Action dated Dec. 8, 2015 with English Translation.

* cited by examiner

*Primary Examiner* — Georgia Y Epps
*Assistant Examiner* — Carolynn A Moore
(74) *Attorney, Agent, or Firm* — McGinn IP Law Group, PLLC

(57) ABSTRACT

A semiconductor device including: a filter circuit to subdivide and output the received signal as a first signal with a relatively low frequency and a second signal with a relatively high frequency; a first channel containing a photocoupler to convey the first signal output from the filter circuit; a second channel containing an isolator to convey the second signal from the filter circuit; and a signal synthesis circuit to sum and output the first signal conveyed by way of a first channel and a second signal conveyed by way of a second channel.

20 Claims, 8 Drawing Sheets

SEMICONDUCTOR DEVICE FOR ELECTRICAL ISOLATION USING A PHOTOCOUPLER AND ISOLATOR TO CONVEY A SIGNAL

CROSS-REFERENCE TO RELATED APPLICATIONS

The disclosure of Japanese Patent Application No. 2012-116228 filed on May 22, 2012 including the specification, drawings and abstract is incorporated herein by reference in its entirety.

BACKGROUND

The present invention relates to a semiconductor device and relates for example to an isolator for ensuring electrical insulation and conveying signals.

An isolator is a semiconductor device that electrically insulates the sending side that sends a signal, from the receiving side that receives a signal sent from the sending side. U.S. Patent Application Publication No. 2009-0295451 discloses a semiconductor device in which the sending side and receiving side are insulated by an isolation barrier including a capacitor.

In the semiconductor device disclosed in U.S. Patent Application Publication No. 2009-0295451 the sending side apportions and sends a signal on a DC Channel (DC signal transmission path) and an AC channel (AC signal transmission path) according to the transmission rate. The DC channel and the AC channel both contain a capacitive coupling type isolator that includes a capacitor. The DC channel transmits signals of 100 Kbps or less, and the AC channel transmits signal of 100 Kbps or higher. The applicable semiconductor device functions as an isolator capable of transmitting not only AC signals but also DC signals while keeping the sending side and receiving side insulated from each other.

U.S. Pat. No. 7,075,329 discloses an inductive coupling type isolator including an inductor.

SUMMARY

The following analysis was rendered by the present inventors.

In the semiconductor device disclosed in U.S. Patent Application Publication No. 2009-0295451 the signal transmission lines are separated into an AC signal transmission line to transmit high-speed signals, and a DC signal transmission line to transmit low-speed signals, with a signal transmission rate of approximately 100 Kbps as the dividing boundary for these signal transmission lines. The DC signal transmission line transmits DC signals based on capacitive coupling. A modulator circuit and a demodulator circuit were therefore required in order to send a DC signal along the DC signal transmission line in the semiconductor device disclosed in U.S. Patent Application Publication No. 2009-0295451 giving rise to the problem of a complicated circuit structure.

Moreover, the isolator was utilized for electrical insulation (isolation) between the industrial machine microcomputer side and the motor drive side. This arrangement made the noise immunity of the isolator itself a crucial factor. However in the semiconductor device disclosed in U.S. Patent Application Publication No. 2009-0295451 the modulator-demodulator circuit itself contained structural elements that were a source of noise (e.g. oscillator). This caused the problem of noise affecting the signal transmission and malfunctions or faulty operation due to effects from external noise.

The semiconductor device disclosed in U.S. Patent Application Publication No. 2009-0295451 as described above contains a structure that transmits DC signals by utilizing a capacitive coupling type isolator and therefore required a modulator circuit and a demodulator circuit in the DC signal transmission path. The semiconductor device of U.S. Patent Application Publication No. 2009-0295451 therefore had the problems of a complicated circuit structure and low noise immunity.

The issue thereupon became how to improve the noise immunity along with simplifying the circuit structure of the isolator for transmitting DC signals and AC signals. The issue in particular was how to achieve a simple structure without loss of the isolation function on the signal line passing the DC signal. Other issues and novel features are clarified in the accompanying drawings and the description in the specifications of the present invention.

According to one aspect of this invention, a semiconductor device includes: a filter circuit to subdivide and output the received signal as a first signal with a relatively low frequency and a second signal with a relatively high frequency; a first channel containing a photocoupler to transmit the first signal output from the filter circuit; a second channel containing an isolator to transmit the second signal output from the filter circuit; and a signal synthesis circuit to sum and output the first signal transmitted by way of a first channel and a second signal transmitted by way of a second channel.

According to another aspect of this invention, a semiconductor device includes: a first filter circuit to subdivide and output a signal received from a first input terminal as a first signal with a relatively low frequency and a second signal with a relatively high frequency; a second filter circuit to subdivide and output a signal received from a second input terminal as a third signal with a relatively low frequency and a fourth signal with a relatively high frequency; a first channel containing a first photocoupler to transmit the first signal output from the first filter circuit; a second channel containing a first isolator to transmit the second signal output from the first filter circuit; a third channel containing a second photocoupler to transmit a third signal output from the second filter circuit; a fourth channel containing a second isolator to transmit the fourth signal output from the second filter circuit; a first signal synthesis circuit to sum and output the first signal transmitted by way of the first channel and a second signal transmitted by way of the second channel; and a second signal synthesis circuit to sum and output the third signal transmitted by way of a third channel and the fourth signal transmitted by way of the fourth channel.

According to the aspects of this invention, the semiconductor device is capable of improving the noise immunity as well as rendering a simple circuit structure for the isolator transmitting the DC signal and AC signal.

DETAILED DESCRIPTION

Figure 1:
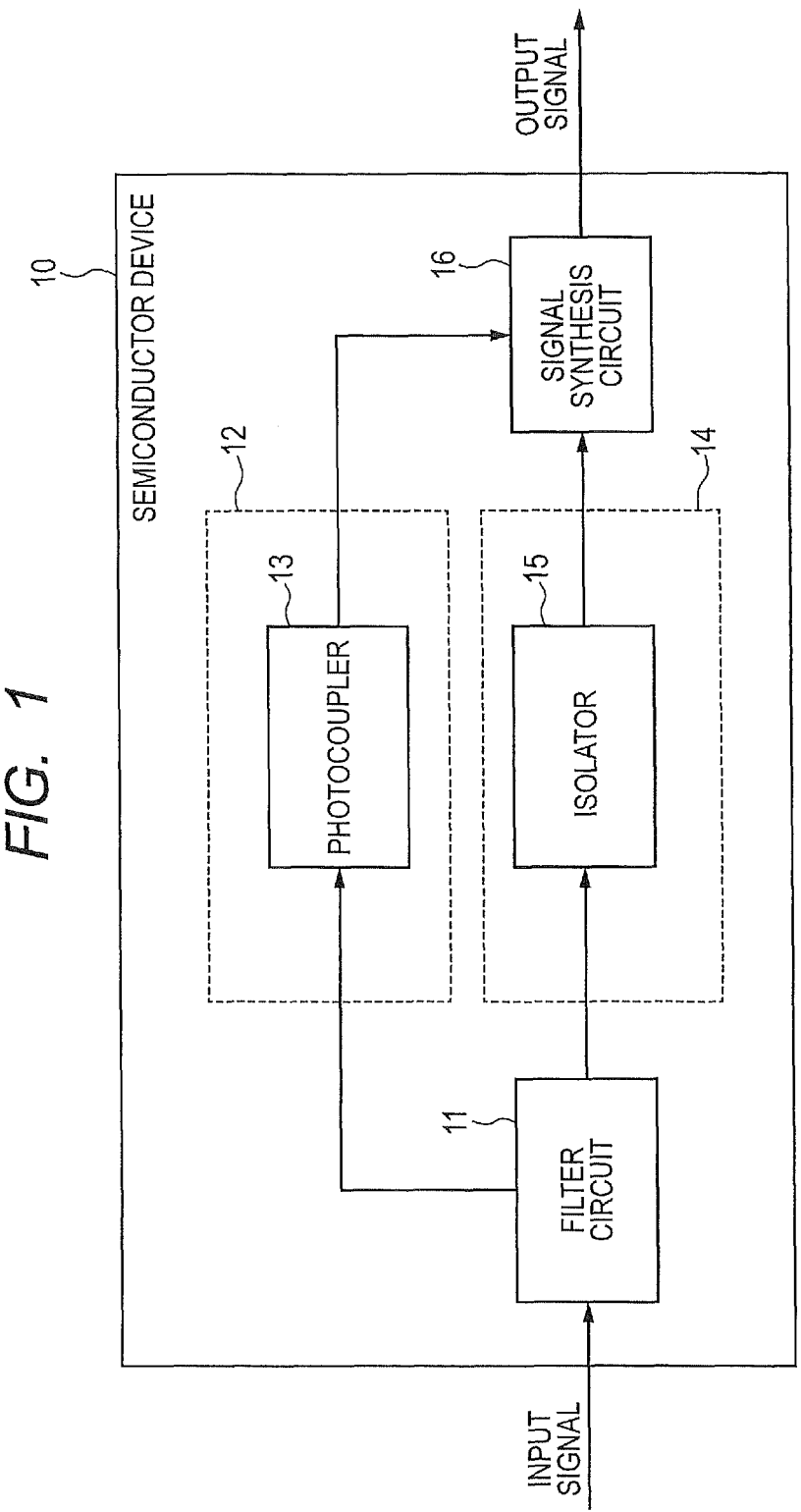
FIG. 1 is a block diagram showing one example of the structure of the semiconductor device of the first embodiment.

An overview of the first embodiment is first of all described. The drawing reference numerals accompanying this overview are solely to assist in acquiring an understanding and are not intended to limit the invention to the state shown in the drawings.

FIG. 1 is a block diagram for showing a structure of the semiconductor device of the first embodiment. In the first embodiment, a photocoupler is provided for the DC signal line and a light emitter and a photo detector are substituted for the capacitive coupling isolator of U.S. Patent Application Publication No. 2009-0295451.

Referring now to FIG. 1, the semiconductor device 10 includes: a filter circuit 11 to subdivide and output the received signal as a first signal with a relatively low frequency and a second signal with a relatively high frequency; a first channel (DC channel 12) containing a photocoupler 13 to transmit the first signal output from the filter circuit 11; a second channel (AC channel 14) containing an isolator 15 to transmit the second signal output from the filter circuit 11; and a signal synthesis circuit 16 to sum and output the first signal transmitted by way of the first channel 12 and a second signal transmitted by way of the second channel 14.

The semiconductor device of the present invention is capable of improving the noise immunity along with achieving a simplified circuit structure for the isolator that transmits the DC signal and AC signal. These points are achieved because providing a photocoupler in the DC channel to transmit the DC signal allows omitting the modulator circuit and demodulator circuit in the DC signal transmission path so that the circuit structure can be simplified and there is no possibility of the modulator circuit and demodulator circuit functioning as a noise source.

First Embodiment

The semiconductor device of the first embodiment is described next while referring to the drawings. FIG. 1 is a block diagram showing one example of the structure of the semiconductor device 10 of the present embodiment.

Referring to FIG. 1, the semiconductor device 10 contains a filter circuit 11, a DC channel 12, an AC channel 14, and a signal synthesis circuit 16. The filter circuit 11 subdivides the received input signal into a first signal having a relatively low frequency (for example a signal below 100 Kbps, hereafter called a "DC signal"), and a second signal having a relatively high frequency (for example a signal of 100 Kbps or higher, hereafter called an "AC signal"), and along with outputting the first signal to the DC channel 12, output the second signal to the AC channel 14. The DC channel 12 contains a photocoupler 13 to transmit the DC signal output from the filter circuit 11. The AC channel 14 contains an isolator 15 to transmit the AC signal output from the filter circuit 11. The signal synthesis circuit 16 sums and outputs the DC signal sent by way of the DC channel 12, and the AC signal sent by way of the AC channel 14.

Figure 2:
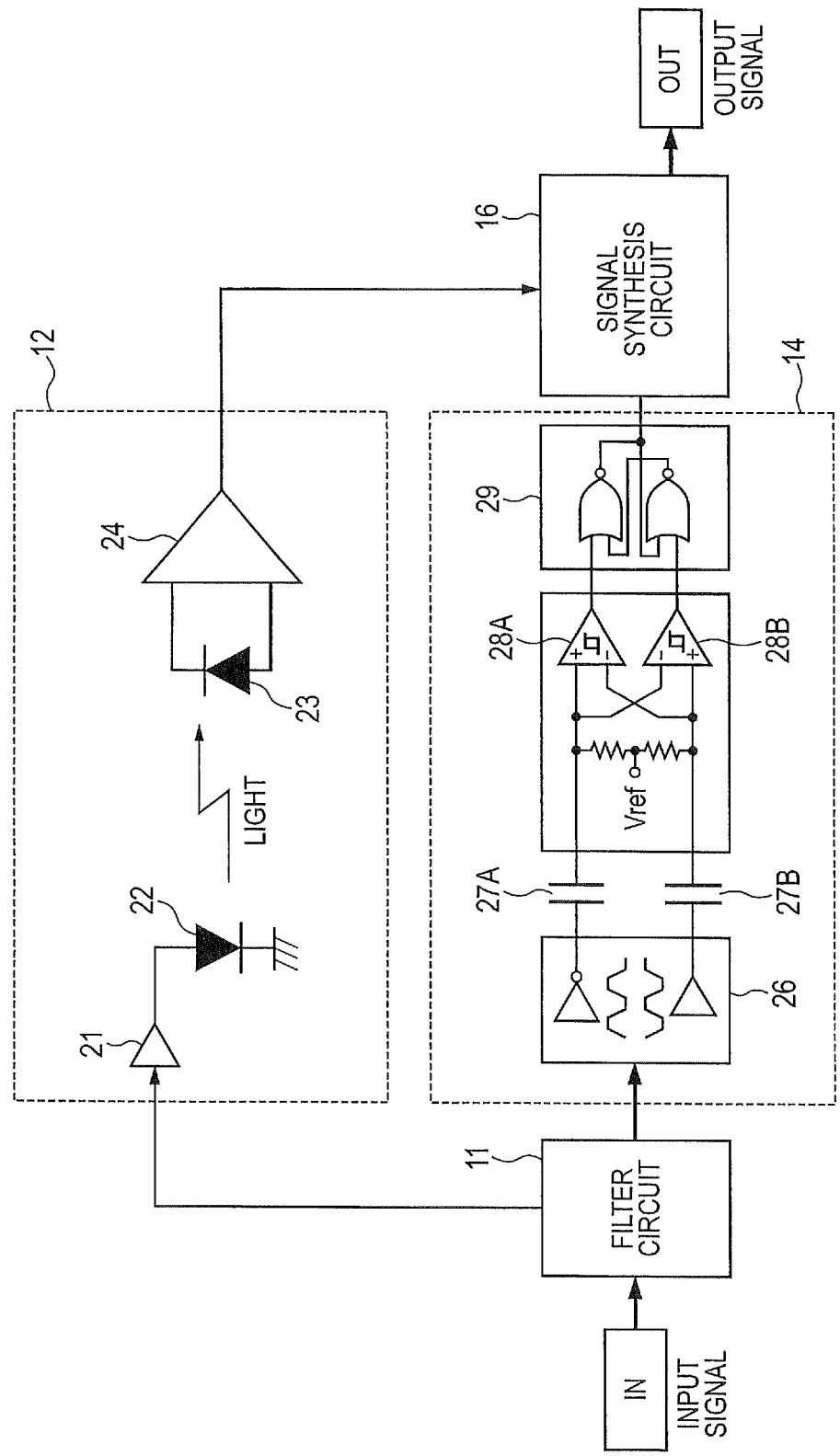
FIG. 2 is a drawing showing one example of the circuit structure of the semiconductor device of the first embodiment.

FIG. 2 is a drawing showing one example of the circuit structure of the semiconductor device 10 of the present embodiment. Referring to FIG. 2, the primary side and the secondary side in the semiconductor device 10 are electrically insulated by a photocoupler and a capacitive coupling type isolator. The semiconductor device 10 includes a DC channel 12 to transmit a low frequency side (low-speed) signal (for example, a signal below 100 Kbps), and an AC channel 14 to transmit a high-frequency side (high-speed) signal (for example a signal of 100 Kbps or higher) according to the transmission signal speed. The upper threshold and lower threshold values for the low-frequency and high-frequency side signal transmission speed (or frequency of the signal) are not limited to the values utilized here.

The photocoupler 13 within the DC channel 12 contains a LED (Light Emitting Diode) 22, an LED driver 21 to drive the LED 22 according to the DC signal, a PD (Photo Diode) 23 to receive light from the LED 22, and an amp 24 to amplify the output signal from the PD 23. The isolator 15 within the AC channel 14 contains the capacitors 27A, 27B. The isolator 15 in other words is a capacitive coupling type isolator including the capacitors 27A, 27B.

The insulation scheme for the isolator 15 is not limited to the capacitive coupling type shown in FIG. 2, and may be an inductive coupling type isolator containing an inductor as disclosed in U.S. Pat. No. 7,075,329.

Referring to FIG. 2, the AC channel 14 contains a buffer/inverter circuit 26, the capacitors 27A, 27B, comparators 28A, 28B, and the RS latch circuit 29. The buffer/inverter circuit 26 receives a high-frequency side signal output from the filter circuit 11. The signal output from the inverter side of the buffer/inverter circuit 26 is supplied to the capacitor 27A. On the other hand, the signal output from the buffer side of the buffer/inverter circuit 26 is supplied to the capacitor 27B. The outputs from the capacitors 27A, 27B are first DC-biased by the reference voltage $V_{ref}$ and next supplied to the comparators 28A, 28B configuring a window comparator. The output from the window comparators 28A, 28B is supplied to the RS latch circuit 29. The output from the RS latch circuit 29 is supplied to the signal synthesis circuit 16.

Figure 3:
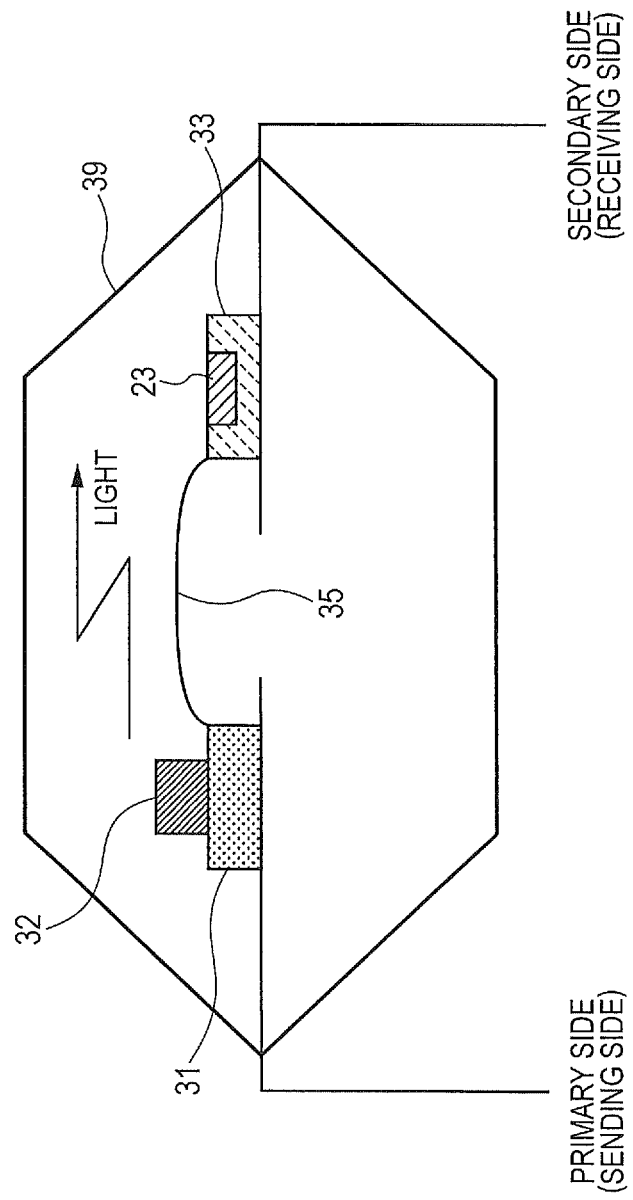
FIG. 3 is a concept diagram showing one example of the layout (cross sectional view) of the semiconductor device of the first embodiment.
Figure 4:
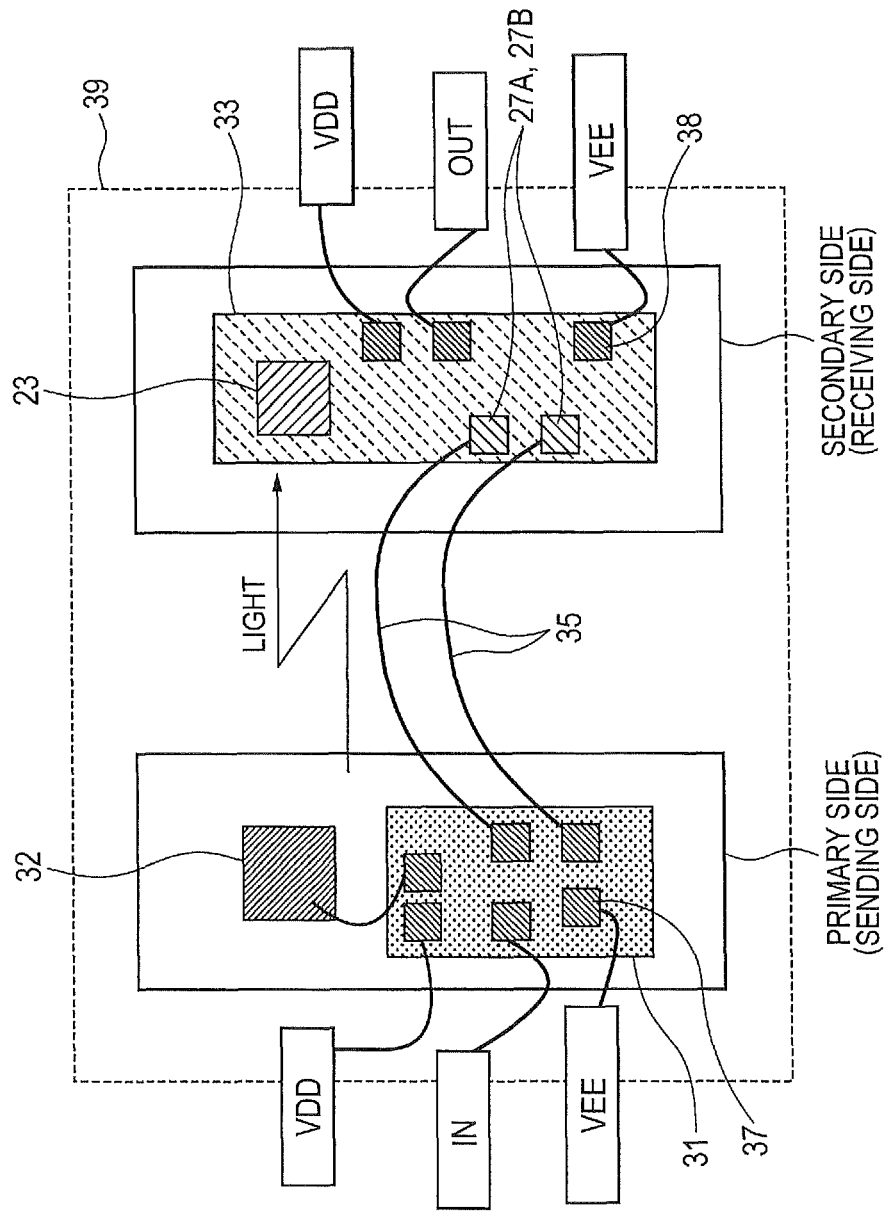
FIG. 4 is an illustrative view showing one example of the layout (plan view) of the semiconductor device of the first embodiment.

FIG. 3 is a drawing showing one example of the layout (cross sectional view) of the semiconductor device 10 of the present embodiment. FIG. 4 is a drawing showing one example of the layout (plan view) of the semiconductor device 10 of the present embodiment. FIG. 4 shows the chip placement in the flat plane within the mold.

Referring to FIG. 3 and FIG. 4, the semiconductor device 10 includes a first semiconductor chip 31 containing a filter circuit 11; a second semiconductor chip 32 including an LED 22; and a third semiconductor chip 33 containing a PD 23, the capacitors 27A, 27B and a signal synthesis circuit 16.

Referring to FIG. 3, the semiconductor chip 31 containing an internal sending side IC (Integrated Circuit) and the semiconductor chip 32 containing an internal LED 22 are mounted over the primary side lead frame within the interior of the mold resin 39. Only a semiconductor chip 33 containing an internal receiving side IC on the other hand is mounted over the secondary side lead frame. The semiconductor chip 33 contains an internal AC signal insulation device (capacitors 27A, 27B) and the photodiode 22 as the receiving side IC. The bonding wire 35 couples the pads 37 to the capacitors 27A, 27B of the semiconductor chip 33 in order to transmit the AC signal from the primary side to the secondary side.

The semiconductor chip 31 contains a plurality of pads 37. These pads 37 are coupled respectively to the high-voltage power supply VDD, the low-voltage power supply VEE, the input terminal IN, one end of the bonding wire 35, and one end of the wire to the semiconductor chip 32. The semiconductor chip 33 on the other hand includes a plurality of pads 38. These pads 38 are respectively coupled to the high-voltage power supply VDD, the low-voltage power supply VEE, the output terminal OUT, and the other end of the bonding wire 35. The upper electrode for the capacitors 27A, 27B also functions as the pad 38.

A DC signal receiving scheme (PD 23), an AC signal receiving scheme, and a signal synthesis circuit 16 for synthesizing AC signal and DC signal can be mounted in a single semiconductor chip 33 per the structure shown in FIG. 3 and FIG. 4. The semiconductor chip to mount on the secondary side (receiving side) can at this time be a single semiconductor chip 33 to allow achieving an isolator to transmit the DC signal and AC signal at a low cost.

Figure 5:
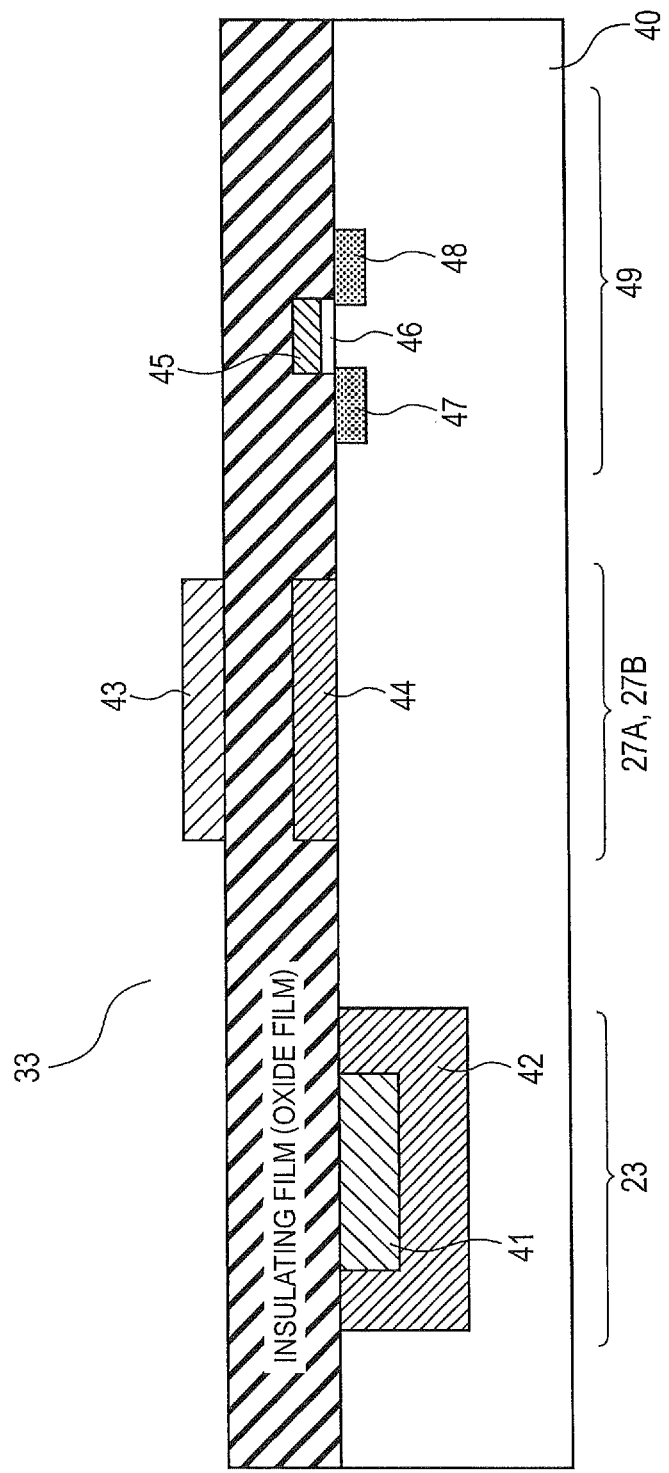
FIG. 5 is a cross sectional view showing one example of the device structure of the semiconductor chip (receiving side IC) contained in the semiconductor device of the first embodiment.

FIG. 5 is a cross sectional view showing one example of the device structure of the semiconductor chip 33. Referring to FIG. 5, in the semiconductor chip 33, the PD 23 and the capacitors 27A, 27B are preferably formed over a single substrate (for example, P-type silicon substrate 40). Moreover, not only the PD 23 and the capacitors 27A, 27B but also an IC section 49 for the signal synthesis circuit 16 and so on can also preferably be mounted over a single substrate in the semiconductor chip 33. In FIG. 5 only one capacitor and one transistor each are shown for purposes of simplicity.

Referring to FIG. 5, an IC section 49 including a transistor, the capacitors 27A, 27B, and the PD 23 are formed over the P-type silicon (Si) substrate 40. The transistor includes a gate electrode 45, a gate oxide film 46, a source diffusion layer 47 and a drain diffusion layer 48. The upper electrode 43 and the lower electrode 44 for the capacitors 27A, 27B are formed from metal such as aluminum (Al). The upper electrode 43 also serves as a bonding pad section 38 for receiving the AC signal from the semiconductor chip 31 mounted on the sending side. The PD 23 contains an N-type diffusion layer 42 formed over the upper section of the P-type silicon substrate 40, and the P-type diffusion layer 41 formed over the upper section of the N-type diffusion layer 42.

The semiconductor chip 33 shown in FIG. 5 is manufactured such as described in the following example. First of all, P-type and N-type ion injection (doping) is performed to form the diffusion layer over the P-type silicon substrate 40, and then PD 23, and the source diffusion layer 47 and drain diffusion layer 48 for the transistor are then formed. A typical semiconductor IC manufacturing wiring (layer) process is then performed over the P-type silicon substrate 40 to form the upper electrode 43 and the lower electrode 44 of the capacitors 27A, 27B. The semiconductor chip 31 containing an internal sending side IC does not require the forming of a photodiode and capacitor so that the semiconductor chip 31 may be rendered as an IC such as a normal CMOS (Complementary Metal Oxide Semiconductor).

The semiconductor chip 33 can be manufactured at a low cost since the PD 23, the capacitors 27A, 27B, and the IC section 49 can all be simultaneously formed over the single silicon substrate 40 in the semiconductor chip 33.

The operation of the semiconductor device of the present embodiment is described next while referring to FIG. 2. The filter circuit 11 sub-divides the input signal according to frequency, and supplies a low-frequency side signal (DC signal) to the DC channel 12, and a high-frequency side signal (AC signal) to the AC channel 14. The filter circuit 11 can as one example, be rendered as a circuit containing the functions of both a low-pass filter and a high-pass filter. The filter circuit 11 may also be configured to divide the input signal into a high frequency signal and a low frequency signal utilizing a specified frequency (or signal transmission rate) as the boundary point.

The DC signal output from the filter circuit 11 causes the LED driver 21 to drive the LED 22 to emit light. The PD 23 receives the optical signal from the LED 22 and converts the optical signal to a current signal. The amp 24 amplifies the current signal output from the PD 23 and outputs the amplified signal to the signal synthesis circuit 16.

On the other hand, the AC signal output from the filter circuit 11 is amplified in the buffer/inverter circuit 26 and is output to the signal synthesis circuit 16 after passing through the capacitors 27A, 27B containing the applicable signal bandwidth, and the signal processing circuit (for example, the window comparators 28A, 28B, RS latch circuit 29).

The output from the semiconductor device is a single output so the signal synthesis circuit 16 which is equivalent to the final circuit unit synthesizes the signals that passed through both the AC channel 14 and DC channel 12 (signal lines). The signal synthesis circuit 16 synthesizes the DC signal output from the amp 24 and the AC signal output from the latch circuit 29 and outputs the synthesized signals.

The semiconductor device disclosed in U.S. Patent Application Publication No. 2009-0295451 requires the installation of a complicated signal processing circuit (e.g. modulator circuit, demodulator circuit) in order to communicate while bypassing the insulation device (capacitor) since the DC signal cannot pass through the insulation device (capacitor). In the semiconductor device of the present embodiment shown in FIG. 2, however the optical signal can be converted as is into photo current by the photo detector when employing a photocoupler containing a LED 22 and a PD 23, in the DC channel 12 that transmits the DC signal. The semiconductor device of the present embodiment can therefore be rendered with a vastly simpler circuit structure than the semiconductor device disclosed in U.S. Patent Application Publication No. 2009-0295451.

The signal processing circuit for implementing the semiconductor device disclosed in U.S. Patent Application Publication No. 2009-0295451 requires a noise-preventer circuit to safeguard against effects from external noise and noise generated within the signal processor itself. In the semiconductor device of the present embodiment shown in FIG. 2 however only the installation of an electrical shield film over the PD 23 is required to protect against noise. The semiconductor device of the present embodiment can therefore easily provide high noise immunity.

Second Embodiment

Figure 6:
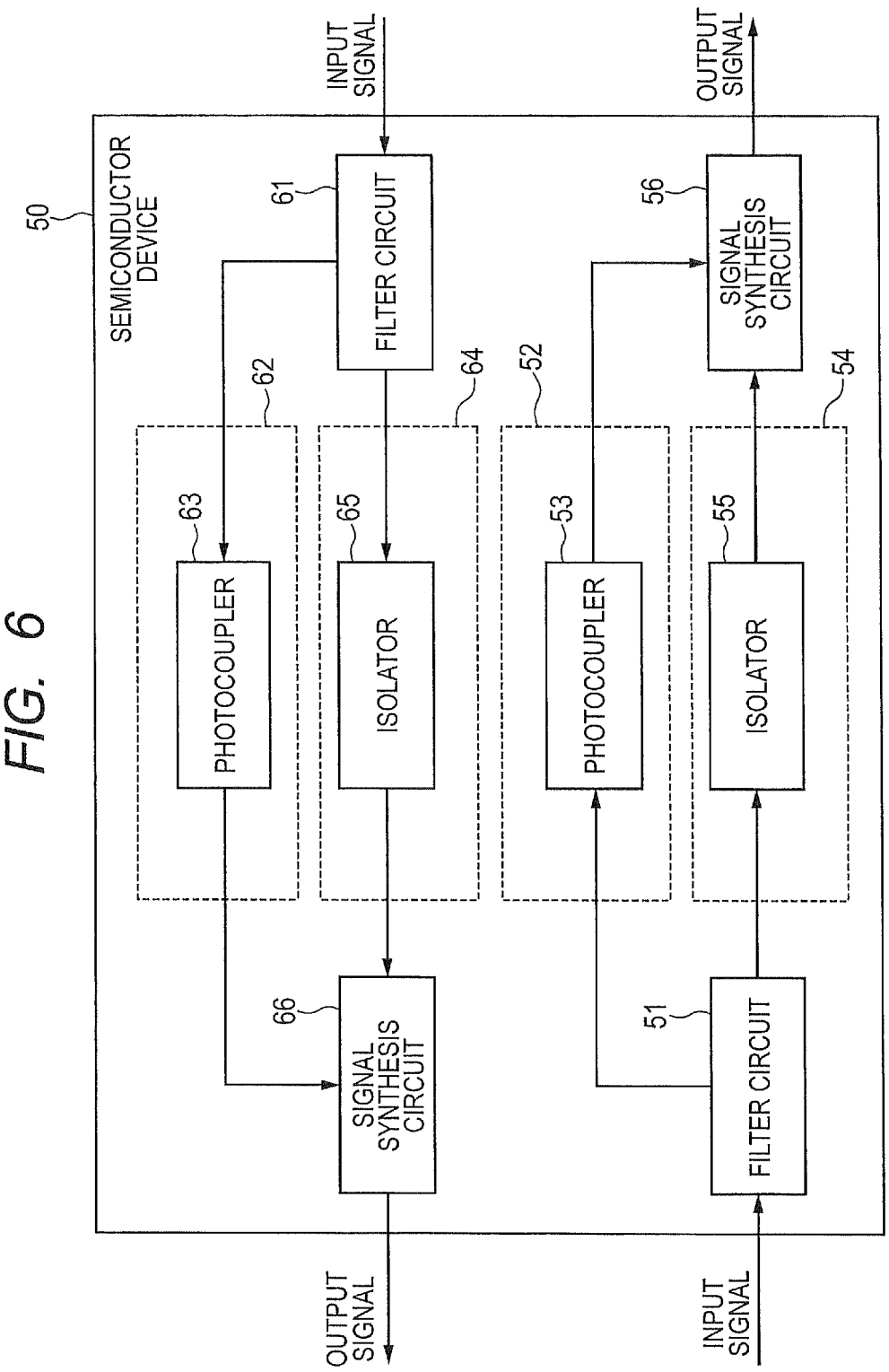
FIG. 6 is a block diagram showing one example of the structure of the semiconductor device of the second embodiment.

The semiconductor device of the second embodiment is described while referring to the accompanying drawings. The semiconductor device of the second embodiment is capable of two-way communication while maintaining isolation between the primary side and the secondary side. FIG. 6 is a block diagram showing one example of the structure of the semiconductor device 50 of the present embodiment.

Referring to FIG. 6, the semiconductor device 50 includes a filter circuit 51, a DC channel 52, an AC channel 54, and a signal synthesis circuit 56 in order to communicate from the primary side to the secondary side. The semiconductor device 50 also includes a filter circuit 61, a DC channel 62, an AC channel 64, and a signal synthesis circuit 66 in order to communicate from the secondary side to the primary side The filter circuit 51 subdivides the signal received from the first input terminal mounted on the primary side into a first signal having a relatively low frequency (for example a signal below 100 Kbps, hereafter called a "DC signal"), and a second signal having a relatively high frequency (for example a signal of 100 Kbps or higher, hereafter called an "AC signal") and outputs those signals. The filter circuit 61 in the same way, subdivides a signal received from a second input terminal mounted on the secondary side into a third signal having a relatively low frequency (for example a signal below 100 Kbps, hereafter called a "DC signal"), and a fourth signal having a relatively high frequency (for example a signal of 100 Kbps or higher, hereafter called an "AC signal") and outputs those signals.

The upper threshold values and lower threshold values for the low-frequency side and high-frequency side signal transmission speed (or frequency of the signal) in communication from the primary side to the secondary side, and from the secondary side to the primary side are not limited to the values utilized here. Also, different upper threshold values and lower threshold values than those above may be utilized in communication from the primary side to the secondary side, and from the secondary side to the primary side.

The DC channel 52 contains a photocoupler 53 to transmit the DC signals output from the filter circuit 51. The AC channel 54 on the other hand contains an isolator 55 to transmit the AC signals output from the filter circuit 51. The DC channel 62 contains a photocoupler 63 to transmit the DC signal from the filter circuit 61. The AC channel 64 on other hand contains an isolator 65 to transmit the AC signal output from the filter circuit 61.

The signal synthesis circuit 56 sums and outputs the DC signal conveyed by way of the DC channel 52, and the AC signal conveyed by way of the AC channel 14. The signal synthesis circuit 66 in the same way sums and outputs the DC signal conveyed by way of the DC channel 62 and the AC signal conveyed by way of the AC channel 64.

The semiconductor device of the second embodiment is capable of providing improved noise immunity as well as simplifying the circuit structure of the isolator for two-way transmission of DC signals and AC signals. These features are achieved because providing the photocouplers 53, 63 in the DC channels 52, 62 that transmit the DC signal allows omitting the modulator circuit and demodulator circuit in the DC signal transmission path so that the circuit structure can be simplified and there is no possibility of the modulator circuit and demodulator circuit functioning as a noise source.

Figure 7:
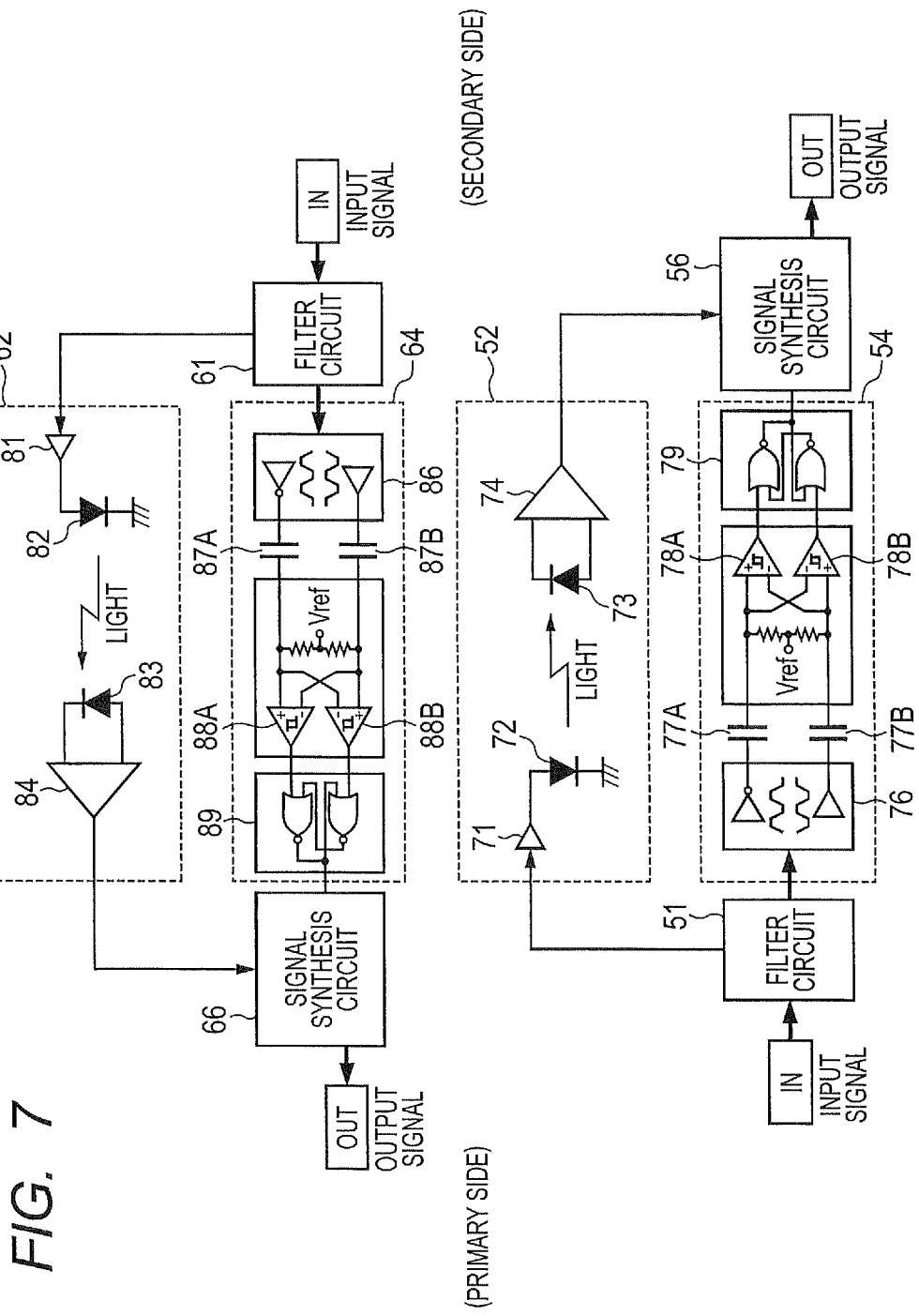
FIG. 7 is a block diagram showing one example of the circuit structure of the semiconductor device of the second embodiment.

FIG. 7 is a drawing showing one example of the circuit structure of the semiconductor device of the present embodiment. Referring to FIG. 7, the primary side and the secondary side in the semiconductor device are electrically insulated by a photocoupler and a capacitive coupling type isolator. The semiconductor device includes the DC channels 52, 62 to transmit a low frequency side (low-speed) signal (for example, a signal below 100 Kbps), and the AC channels 54, 64 to transmit a high-frequency side (high-speed) signal (for example a signal of 100 Kbps or higher) according to the transmission signal speed.

The photocoupler 53 mounted within the DC channel 52 contains a LED (Light Emitting Diode) 72, and an LED driver 71 to drive the LED 72 according to the DC signal, a PD (Photo Diode) 73 to receive light from the LED 72, and an amp 74. The isolator 55 mounted within the AC channel 54 contains the capacitors 77A, 77B. In other words, the isolator 55 is a capacitive coupling type isolator including the capacitors 77A, 77B. The insulation scheme for the isolator 55 is not limited to the capacitive coupling type, and may be an inductive coupling type isolator containing an inductor as disclosed in U.S. Pat. No. 7,075,329.

The AC channel 54 contains a buffer/inverter circuit 76, the capacitors 77A, 77B, the comparators 78A, 78B, and the RS latch circuit 79. The buffer/inverter circuit 76 receives a high-frequency side signal (AC signal) output from the filter circuit 51. The signal output from the inverter side of the buffer/inverter circuit 76 is supplied to the capacitor 77A. On the other hand, the signal output from the buffer side of the buffer/inverter circuit 76 is supplied to the capacitor 77B. The outputs from the capacitors 77A, 77B are first of all DC-biased by the reference voltage $V_{ref}$ and next supplied to the comparators 78A, 78B that configure a window comparator. The output from the window comparators 78A, 78B is supplied to the RS latch circuit 79. The output from the RS latch circuit 79 is supplied to the signal synthesis circuit 56.

The photocoupler 63 mounted within the DC channel 62 contains a LED (Light Emitting Diode) 82, and an LED driver 81 to drive the LED 82 according to the DC signal, a PD (Photo Diode) 83 to receive light from the LED 82, and an amp 84. The isolator 65 mounted within the AC channel 64 contains the capacitors 87A, 87B. The isolator 65 in other words is a capacitive coupling type isolator including the capacitors 87A, 87B. The insulation scheme for the isolator 65 is not limited to the capacitive coupling type shown in FIG. 7, and may be an inductive coupling type isolator containing an inductor as disclosed in U.S. Pat. No. 7,075,329.

The AC channel 64 contains a buffer/inverter circuit 86, the capacitors 87A, 87B, the comparators 88A, 88B, and the RS latch circuit 89. The buffer/inverter circuit 86 receives a high-frequency side signal (AC signal) output from the filter circuit 61. The signal output from the inverter side of the buffer/inverter circuit 86 is supplied to the capacitor 87A. On the other hand, the signal output from the buffer side of the buffer/inverter circuit 86 is supplied to the capacitor 87B. The outputs from the capacitors 87A, 87B are first DC-biased by the reference voltage $V_{ref}$ and next supplied to the comparators 88A, 88B that configure a window comparator. The output from the window comparators 88A, 88B is supplied to the RS latch circuit 89. The output from the RS latch circuit 89 is supplied to the signal synthesis circuit 66.

Figure 8:
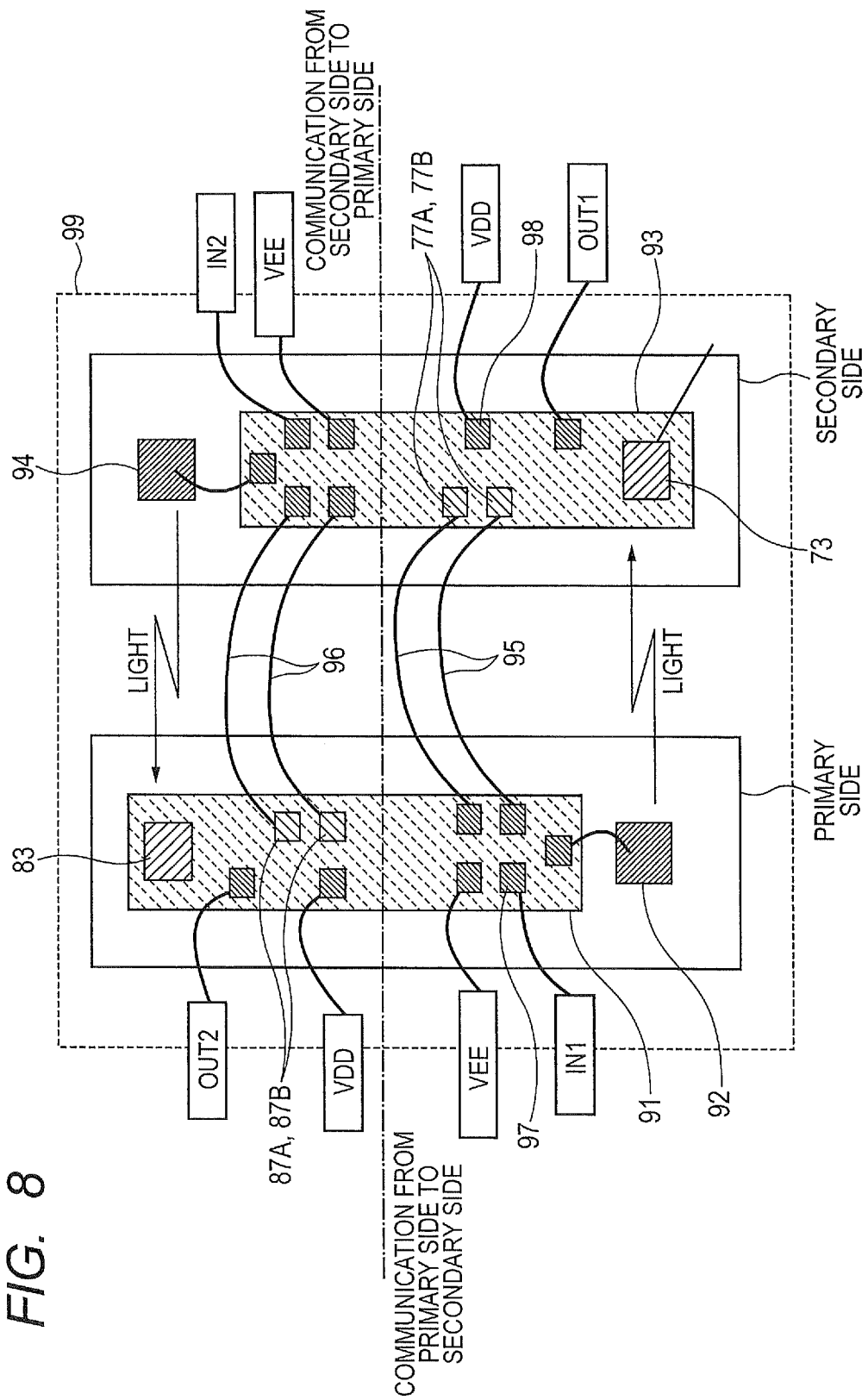
FIG. 8 is an illustrative drawing showing one example of the layout (plan view) of the semiconductor device of the second embodiment.

FIG. 8 is an illustrative drawing showing one example of the layout (plan view) of the semiconductor device of the present embodiment. FIG. 8 shows the chip placement in the flat plane within the mold.

Referring to FIG. 8, the section below the broken line is equivalent to the module for carrying out communications from the primary side to the secondary side; and the section above the broken line is equivalent to the module for carrying out communications from secondary side to the primary side. Along with containing internal capacitors and photodiodes the same as in the semiconductor chip (receiving side IC) 33 of the first embodiment; the semiconductor chips 91, 93 for both the primary side and the secondary side also contain an internal transmitter function block, and the chips are placed within the interior of the mold resin 99, the same as the mold resin 39 shown in FIG. 3.

Referring to FIG. 8, the semiconductor device 50 contains the semiconductor chip 91 and the semiconductor chip 92 over the primary side lead frame. The semiconductor device 50 also contains the semiconductor chip 93 and the semiconductor chip 94 over the secondary side lead frame. The semiconductor chip 91 includes a filter circuit 51, a signal synthesis circuit 66, a PD (Photo Diode) 83, and the capacitors 87A, 87B. The semiconductor chip 92 contains a LED 72. The semiconductor chip 93 contains a filter circuit 61, a signal synthesis circuit 56, a PD (Photo Diode) 73, and the capacitors 77A, 77B. The semiconductor chip 94 contains a LED 82.

The semiconductor chip 91 contains a plurality of pads 97. These pad 97 are coupled respectively to the high-voltage power supply VDD, the low-voltage power supply VEE, the input terminal IN1, the output terminal OUT2, one end of the bonding wires 95, 96, and one end of the wire to the semiconductor chip 92. The upper electrode for the capacitors 87A, 87B also function as the pad 97. The semiconductor chip 93 on the other hand includes a plurality of pads 98. These pads 98 are respectively coupled to the high-voltage power supply VDD, the low-voltage power supply VEE, the output terminal OUT1, the input terminal IN2, and the other end of the bonding wires 95, 96. The upper electrode for the capacitors 77A, 77B also functions as the pad 98.

In the structure shown in FIG. 8, the filter circuit 52 for signals conveyed from the primary side to the secondary side, and the receiving scheme (PD 83) for receiving the DC signal sent from the secondary side to the primary side, the AC signal insulation scheme (capacitors 87A, 87B) and the signal synthesis circuit 66 can be mounted over a single semiconductor chip 91. Also, the receiving scheme (PD 73) for receiving the DC signal sent from the primary side to the secondary side, the AC signal insulation scheme (capacitors 77A, 77B) and signal synthesis circuit 56, along with the filter circuit 61 for the signal conveyed from the secondary side to the primary side can be mounted over a single semiconductor chip 93. The number of semiconductor chips mounted over the primary side and secondary side can be set as two each at this time so that an isolator for conveying the DC signal and the AC signal in both directions can be achieved at a low cost.

Though not shown in the drawing, the PD 83 and the capacitors 87A, 87B are preferably formed over a single substrate (for example, P-type silicon substrate) in the semiconductor chip 91. The PD 73 and the capacitors 77A, 77B are also preferably formed over a single substrate in the semiconductor chip 93. Moreover, on the semiconductor chip 91, not only the PD 83 and the capacitors 87A, 87B, but also the filter circuit 51 and the signal synthesis circuit 66 are preferably formed over a single substrate. On the semiconductor chip 93, not only the PD 73 and the capacitors 77A, 77B, but also the filter circuit 61 and the signal synthesis circuit 56 are also preferably formed over a single substrate.

The semiconductor chip 91 can be manufactured at a low cost since the PD 83, the capacitors 87A, 87B and the IC section can all be simultaneously formed over a single silicon substrate in the semiconductor chip 91. The semiconductor chip 93 can in the same way be manufactured at a low cost, since the PD 73, the capacitors 77A, 77B and the IC section can also be simultaneously formed on a single silicon substrate.

The disclosures in the aforementioned patent documents are incorporated by reference into these specifications. All manner of changes and adjustments are permissible within the scope of the full disclosure of the present invention (including the range of the claims) and further also based fundamental technical concept of the invention. Diverse combinations and selections of the various disclosed elements (including each element of each of the claims, each element of each embodiment, each element of the drawings, etc.) within the scope including the range of the claims of the present invention are permissible. The present invention may in other words therefore include all manner of type adaptations and corrections if attainable by one skilled in the art according to the full disclosure including the range of the claims and technical concept of the present invention.

What is claimed is:

1. A semiconductor device, comprising:
   a filter circuit to sub-divide and output a received signal as a relatively low frequency first signal and a relatively high frequency second signal;
   a first channel containing a photocoupler to convey the first signal output from the filter circuit;
   a second channel containing an isolator, the isolator conveying the second signal output from the filter circuit independent of the output of the photocoupler; and
   a signal synthesis circuit to sum and output the first signal conveyed by way of the first channel and the second signal conveyed by way of the second channel.

2. The semiconductor device according to claim 1, wherein the isolator mounted in the second channel comprises a capacitive coupling type isolator.

3. The semiconductor device according to claim 2, wherein the photocoupler mounted in the first channel contains a light emitting diode to emit light according to the first signal, and a photodiode to receive light from the light emitting diode, and
   wherein the isolator mounted in the second channel contains a capacitor.

4. The semiconductor device according to claim 3, further comprising:
   a first semiconductor chip including the filter circuit;
   a second semiconductor chip including the light emitting diode; and
   a third semiconductor chip including the photodiode, the capacitor, and the signal synthesis circuit.

5. The semiconductor device according to claim 4, wherein the photodiode and the capacitor are formed over a single substrate in the third semiconductor chip.

6. The semiconductor device according to claim 5, wherein the photodiode, the capacitor, and the signal synthesis circuit are formed over a single substrate in the third semiconductor chip.

7. The semiconductor device according to claim 1, wherein the isolator mounted in the second channel comprises an inductive coupling type isolator.

8. The semiconductor device according to claim 1, wherein the first channel comprises a DC channel, and the second channel comprises an AC channel, and
   wherein the semiconductor device further comprises:
   an amplifier that amplifies a current signal output from the photocoupler and outputs the amplified current signal to the signal synthesis circuit.

9. The semiconductor device according to claim 8, wherein, in the first channel, only the amplified current signal is provided to the signal synthesis circuit.

10. The semiconductor device according to claim 1, wherein the photocoupler comprises an LED and a photo diode in the first channel that transmits the first signal to convert an optical signal to a photo current by a photo detector.

11. The semiconductor device according to claim 1, wherein the photocoupler comprises a photo diode in the first channel, and
    wherein, in the semiconductor device, only an electrical shield film installed over the photo diode protects against noise.

12. A semiconductor device, comprising:
    a first filter circuit to sub-divide and output a signal received from a first input terminal into a relatively low frequency first signal and a relatively high frequency second signal;

a second filter circuit to sub-divide and output a signal received from a second input terminal into a relatively low frequency third signal and a relatively high frequency fourth signal;

a first channel including a first photocoupler to convey the first signal output from the first filter circuit;

a second channel including a first isolator, the isolator conveying the second signal output from the first filter circuit independent of the output of the first photocoupler;

a third channel including a second photocoupler to convey the third signal output from the second filter circuit;

a fourth channel including a second isolator to convey the fourth signal output from the second filter circuit;

a first signal synthesis circuit to sum and output the first signal conveyed by way of the first channel and the second signal conveyed by way of the second channel; and a second signal synthesis circuit to sum and output the third signal conveyed by way of the third channel and the fourth signal conveyed by way of the fourth channel.

13. The semiconductor device according to claim 12, wherein the first photocoupler mounted in the first channel includes a first light emitting diode to emit light according to the first signal, and a first photodiode to receive the light from the first light emitting diode, wherein the first isolator mounted in the second channel includes a first capacitor, wherein the second photocoupler mounted in the third channel includes a second light emitting diode to emit light according to the third signal, and a second photodiode to receive the light of the second light emitting diode, and wherein the second isolator mounted in the fourth channel includes a second capacitor.

14. The semiconductor device according to claim 13, further comprising:

a first semiconductor chip including the first filter circuit, the second signal synthesis circuit, the second photodiode, and the second capacitor;

a second semiconductor chip including the first light emitting diode;

a third semiconductor chip including the second filter circuit, the first signal synthesis circuit, the first photodiode, and the first capacitor; and a fourth semiconductor chip including the second light emitting diode.

15. The semiconductor device according to claim 14, wherein the second photodiode and the second capacitor are formed over a single substrate in the first semiconductor chip, and wherein the first photodiode and the first capacitor are formed over a single substrate in the third semiconductor chip.

16. The semiconductor device according to claim 15, wherein the first filter circuit, the second signal synthesis circuit, the second photodiode, and the second capacitor are formed over a single substrate in the first semiconductor chip, and wherein the second filter circuit, the first signal synthesis circuit, the first photodiode, and the first capacitor are formed over a single substrate in the third semiconductor chip.

17. The semiconductor device according to claim 12, wherein the first isolator mounted in the second channel, and the second isolator mounted in the fourth channel, include a capacitive coupling type isolator or an inductive coupling type isolator.

18. The semiconductor device according to claim 12, wherein the second isolator, independent of the output of the second photocoupler, conveys the fourth signal output from the second filter circuit.

19. The semiconductor device according to claim 12, wherein the first channel comprises a DC channel, and the second channel comprises an AC channel, and wherein the semiconductor device further comprises:

an amplifier that amplifies a current signal output from the first photocoupler and outputs the amplified current signal to the first signal synthesis circuit.

20. The semiconductor device according to claim 19, wherein, in the first channel, only the amplified current signal is provided to the first signal synthesis circuit. transmits the first signal to convert an optical signal to a photo current by a photo detector.

* * * * *